US008241941B2

United States Patent
Dubois et al.

(10) Patent No.: US 8,241,941 B2
(45) Date of Patent: Aug. 14, 2012

(54) METHOD OF PURIFYING A CRYSTALLINE SILICON SUBSTRATE AND PROCESS FOR PRODUCING A PHOTOVOLTAIC CELL

(75) Inventors: Sébastien Dubois, Scionzier (FR); Nicolas Enjalbert, Burlats (FR); Rémi Monna, Fontaine (FR)

(73) Assignee: Commissariat a l'Energie Atomique, Paris (FR)

( * ) Notice: Subject to any disclaimer, the term of this patent is extended or adjusted under 35 U.S.C. 154(b) by 282 days.

(21) Appl. No.: 12/499,602

(22) Filed: Jul. 8, 2009

(65) Prior Publication Data
US 2010/0041175 A1  Feb. 18, 2010

(30) Foreign Application Priority Data
Jul. 9, 2008 (FR) ...................... 08 03904

(51) Int. Cl.
*H01L 21/00* (2006.01)
*H01L 21/322* (2006.01)
(52) U.S. Cl. .................. 438/58; 438/473; 257/E21.318
(58) Field of Classification Search .......... None
See application file for complete search history.

(56) References Cited

U.S. PATENT DOCUMENTS
2006/0175613 A1 * 8/2006 Lee et al. ........ 257/65
2008/0157241 A1   7/2008 Kirscht et al.

OTHER PUBLICATIONS

Perichaud, et al., "Effet Getter Dans Des Plaquettes de Silicium Multicristallin Par Diffusion De Phosphore", Journal de Physique, 2:3, 313-324, 1992.
Perichaud, "Gettering of Impurities in Solar Silicon", Solar Energy Materials & Solar Cells 72:1-4, 315-326, 2002.
Loghmarti, et al., "High Phosphorus Gettering Efficiency in Polycrystalline Silicon by Optimisation of Classical Thermal Annealing Conditions", Phys. Stat. Sol. (A), 151:2, 379-386, 1995.
Martinuzzi, et al., "External Gettering by Phosphorus Diffusion Applied to Polycrystalline Silicon Solar Cell Improvement", 9th E.C. Photovoltaic Solar Energy Conference, 458-461, 1989.
Ehret, et al., "Influence of Extended Defects and Native Impurities on External Gettering in Polycrystalline Silicon", Materials Science and Engineering, 34:2, 210-215, 1995.

* cited by examiner

*Primary Examiner* — Seahvosh Nikmanesh
(74) *Attorney, Agent, or Firm* — Morgan, Lewis & Bockius LLP

(57) ABSTRACT

The invention relates to a method of purifying a crystalline silicon substrate and to a process for producing a photovoltaic cell. The method of purifying a crystalline silicon substrate according to the invention is of the type that includes a step of extracting impurities by external gettering and which includes, before said step of extracting the impurities by external gettering, at least one step of rapidly annealing the substrate at a temperature of between 750° C. and 1000° C. inclusive for a time of between 1 second and 10 minutes inclusive. The invention is particularly applicable in the photovoltaic cell field.

20 Claims, No Drawings

METHOD OF PURIFYING A CRYSTALLINE SILICON SUBSTRATE AND PROCESS FOR PRODUCING A PHOTOVOLTAIC CELL

CROSS-REFERENCE TO RELATED APPLICATIONS

The present application claims the benefit of French Application No. 0803904, filed on Jul. 9, 2008, which is herein incorporated by reference in its entirety.

BACKGROUND OF THE INVENTION

The invention relates to a method of purifying a crystalline silicon substrate and to a process for producing a photovoltaic cell.

DESCRIPTION OF THE PRIOR ART

At the present time, much research is being focused on the use of "low-cost" silicon substrates, that is to say substrates made of a silicon that contains high concentrations of impurities, especially metallic impurities, for the manufacture of photovoltaic cells. This low-cost silicon, which may be single-crystal silicon or polycrystalline silicon, i.e. silicon having grains from 1 $mm^2$ to several $cm^2$ in size, produced by columnar growth, which will hereafter be generally called crystalline silicon, generally contains metallic impurities such as Fe, Cr, Cu, etc. at concentrations much higher than in electronic-grade crystalline silicon.

These metallic impurities are present in the silicon in solid solution and/or in the form of precipitates.

In polycrystalline silicon, the precipitates are generally located along extended crystallographic defects (dislocations, grain boundaries, twins). The metallic impurities are virulent recombination centers for the free charges in the silicon. Thus, their presence affects the lifetime of the charge carriers, and consequently the energy conversion efficiency of photovoltaic cells.

Thus, if it is desired to maintain acceptable energy conversion efficiencies using these novel crystalline silicon sources, it is necessary during the process for manufacturing the photovoltaic cell to extract the impurities from the volume of the device, so as to limit, at best, their influence on the performance of the photovoltaic cell.

For this purpose, one solution proposed in the prior art is to extract these impurities by external gettering. The purpose of this method is to remove the metallic impurities from the volume of the silicon substrate so as to confine them to the surfaces of said substrate, where they can no longer have any influence on the operation of the photovoltaic cells manufactured from this substrate.

The effectiveness of this impurity extraction by external gettering is described in particular in "*Mechanisms and computer modeling of transition element gettering in silicon*" by Schröter et al., Solar Energy Materials and Solar Cells 72 (2002), 299-313.

A particularly used method of extracting impurities by external gettering is phosphorus diffusion, which makes it possible not only to extract the metallic impurities but is also a necessary step in the formation of the p-n junction of the photovoltaic cell.

Phosphorus diffusion is therefore very widely used in photovoltaic cell fabrication. However, although impurity extraction by external gettering, and in particular by phosphorus diffusion, does allow effective extraction of metallic impurities initially in the form of a solid solution, especially when they diffuse rapidly, this extraction step proves, in contrast, to be not very effective for extracting metal atoms that are initially present as precipitates. Now, these precipitates alter the electrical properties of extended crystallographic defects and, in addition, during the rapid annealing necessary for establishing the metal contacts in the standard photovoltaic cell fabrication process, they are not stable and put the metallic impurities back into solution, thereby greatly reducing the overall lifetime of the charge carriers and consequently lowering the performance of the photovoltaic cells.

The aim of the invention is to alleviate the drawbacks of the methods of the prior art for purifying crystalline silicon substrates, in particular for photovoltaic cell fabrication.

SUMMARY OF THE INVENTION

For this purpose, the invention provides a method of purifying a crystalline silicon substrate of the type that includes a step of extracting impurities by external gettering, which includes, before said step of extracting the impurities by external gettering, at least one step of heating the substrate at a temperature of between 750° C. and 1000° C. inclusive for a time of between 1 second and 10 minutes inclusive, followed by a step of cooling the substrate down to room temperature.

Preferably, the step of extracting the impurities by external gettering is a phosphorus diffusion step.

In a first preferred embodiment, the purification method of the invention includes a single heating step at a single temperature, followed by a step of cooling the substrate down to room temperature.

In a second preferred embodiment, the purification method of the invention includes at least two heating steps at different temperatures for identical or different times, followed by a step of cooling the substrate down to room temperature.

In this case, the purification method of the invention preferably includes a heating step at between 800° C. and 850° C. for 1 to 20 seconds and a heating step at 885° C. for 1 to 20 seconds, followed by a step of cooling the substrate down to room temperature.

The invention also provides a process for producing a photovoltaic cell of the type that includes a step of texturing the surfaces of a crystalline silicon substrate, which additionally includes the purification of the crystalline silicon constituting the substrate by the purification method of the invention.

In a first preferred embodiment of the process for producing a photovoltaic cell according to the invention, the purification of the crystalline silicon by the method of the invention is implemented before the step of texturing the surfaces of the crystalline silicon substrate.

In a second preferred embodiment of the process for producing a photovoltaic cell of the invention, the purification of the crystalline silicon constituting the substrate by the purification method of the invention is implemented after the step of texturing the surfaces of the crystalline silicon substrate.

DESCRIPTION OF THE PREFERRED EMBODIMENTS

The invention will be better understood and other features and advantages thereof will become more clearly apparent on reading the following explanatory description.

At the present time, the standard process used for the industrial production of p-type photovoltaic cells comprises the following sequential steps:

a) texturing of the surfaces of a crystalline silicon substrate, in general by treatment with a KOH solution, so as to reduce the reflectivity and obtain optical confinement;
b) formation of an n$^+$ layer, by phosphorus diffusion so as to create the p-n junction;
c) deposition of a layer of hydrogenated silicon nitride SiN—H, by PECVD (plasma-enhanced chemical vapor deposition) so as to create an antireflection layer, to passivate the front side and to serve as hydrogen reservoir for passivating the volume of the substrate;
d) deposition of contacts by screen printing, these contacts generally being made of silver on the front side and made of aluminum on the back side;
e) annealing of the contacts in an infrared lamp furnace for establishing the contacts into the silicon.

The expression "texturing one (or more) surface(s) of a substrate", or the term "texturing", is understood within the context of the invention to mean the creation of a succession of hollows and bumps on this surface.

The Al—Si contact on the back side traps the impurities and a p$^+$ zone is created that acts as BSF (back surface field), i.e. as an electric field that repels the minority carriers on the back side of the cell. During this step, hydrogen migrates from the SiN—H layer, thereby passivating the impurities in the volume of the substrate; and
f) opening of the junction, for example by a laser or by a plasma or else by encapsulation or by any other etching means.

Without in any way changing this process, it is also possible to obtain n-type photovoltaic cells. In this case, the aluminum-doped p$^+$ zone on the back side of the cell serves to create the n-p$^+$ junction. The n$^+$ zone obtained by phosphorus diffusion on the front side acts as hole repeller (FSF (front surface field) effect).

Step b) of forming the n$^+$ layer by phosphorus diffusion is not only necessary for the formation of the p-n junction but also develops an external gettering effect for extracting the metallic impurities.

The phosphorus diffusion may be carried out, for example, by a flux of POCl$_3$, PBr$_3$, PH$_3$ or P$_2$O$_5$. This diffusion takes place in two steps. The first step consists in creating a highly phosphorus-doped oxide on the surface of the silicon at a temperature of between 800° C. and 900° C. (for between 10 and 30 minutes) under an oxygen/nitrogen stream bubbled into a vessel containing, preferably, POCl$_3$ in liquid form. The second step consists in making the phosphorus diffuse from the oxide into the silicon at a temperature of between 800° C. and 900° C. (for between 30 seconds and 10 minutes). The diffusion may also be carried out by the spin-on technique or by spraying. The spin-on technique consists in depositing a dopant solution on the surface of the wafers by centrifugation. After the deposition, the solvents are evaporated by annealing at around 170° C. The diffusion step may be carried out in a conventional tube furnace or in a tunnel furnace.

During phosphorus diffusion, the impurities are extracted from the precipitates or from the substitutional sites, and rapid diffusion of these impurities in interstitial positions to the trapping zones or sites located on all the surfaces of the cell takes place. Next, the impurities are captured in these trapping zones or sites. This step is crucial as it must allow the impurities reaching the trapping zones or sites to be fixed by two different mechanisms: firstly, relaxation (precipitation) of supersaturated impurities and, secondly, segregation of the impurities as a consequence of an intended variation in their limited solubility through the crystal.

In addition, although phosphorus diffusion does allow the metallic impurities initially in solid solution to be effectively extracted, especially when they diffuse rapidly, this step proves to be not very effective for extracting metal atoms initially in the form of precipitates. Now, these precipitates degrade the electrical properties of extended crystallographic defects. In addition, in the photovoltaic cell fabrication process currently used, the phosphorus diffusion step b) is followed by the annealing step e) carried out on the contacts deposited by screen printing. This step takes place at temperatures of around 800° C. to 900° C. and, during this step, the metallic impurities initially in precipitate form go back into solution. These metallic impurities that have gone back into solution greatly reduce the overall lifetime of the charge carriers and consequently lower the performance of the photovoltaic cells.

However, it has now been discovered that if a rapid high-temperature annealing operation is carried out on the crystalline silicon substrate used in the production of photovoltaic cells before phosphorus diffusion, the metallic impurities initially in precipitate form go into solution. This makes it possible, in the step of extracting the metallic impurities by external gettering, for them to be extracted effectively and lastingly. The extended crystallographic defects, where the metallic impurities precipitate easily, will therefore be less recombinant and, in addition, the material will be electrically more stable during the process for fabricating the device, especially during any rapid annealing operations.

The rapid annealing step is, as known by those skilled in the art of silicon substrate processing, a step during which the silicon substrate is heated very rapidly, i.e. in a time ranging from a few seconds to a few minutes, to a high temperature, up to 1200° C. at most, and then slowly cooled so as to prevent it from fracturing by heat shock.

This rapid annealing step, also called here "external pre-gettering", generally takes place in static or dynamic lamp furnaces. This rapid annealing may be carried out in air or in a non-oxidizing atmosphere, such as a stream of argon, helium, etc.

In the invention, during the rapid annealing step, the silicon substrate must be heated to a temperature of between 750° C. and 1000° C. for a time of between 1 second and 10 minutes inclusive.

Preferably, this temperature is between 800° C. and 950° C. inclusive. The rapid annealing may consist of a single hold at the desired temperature or a succession of holds at various temperatures, said temperature hold(s) being followed by cooling down to room temperature. Preferably, the rapid annealing step consists of two successive temperature holds, the first hold being carried out at a temperature between 800° C. and 850° C. for 1 to 20 seconds and the second hold being carried out at a temperature of between 850° C. and 920° C. for 1 to 20 seconds.

After this rapid annealing step, the cooling step takes place by natural cooling, after the heating source has been turned off, or else by forced cooling, for example by blowing a stream of air at room temperature over the substrate.

When the cooling is forced cooling, the substrate cooling rate must be preferably greater than 3° C./second.

To gain a better understanding of the invention, several embodiments will now be described as purely illustrative and nonlimiting examples.

Preparation of the Silicon Wafers

Two silicon wafers were cut from the same boron-doped polycrystalline silicon ingot obtained by the Polix® crystallization process. This silicon ingot had a resistivity of between 0.5 and 2 ohms·cm. The wafers were square and had an area of 225 cm$^2$. The grain size varied between a few mm$^2$ and a few cm$^2$.

Comparative Example

A simple phosphorus diffusion treatment was carried out on one of the wafers obtained above. This phosphorus diffusion treatment was the following: a wafer was held vertically in a quartz receptacle which was itself installed in a tube furnace, also made of quartz. The temperature of the furnace was controlled at 870° C. and a low pressure (300 mbar) was maintained in the tube.

A stream of $N_2$ carrier gas containing $POCl_3$ was injected at this temperature and pressure for 18 minutes. Phosphorus glass $P_2O_5$ was deposited on the wafer.

The phosphorus atoms diffused from this phosphorus glass through the silicon matrix, the junction depth depending on the temperature and the duration of the cycle.

The chemical reaction that took place was the following:

$$6POCl_3 + 3O_2 \rightarrow 2P_2O_5 + 6Cl_2.$$

After this phosphorus diffusion step, the $n^+$ diffused layer was etched by chemical etching (using an $HF/CH_3COOH/HNO_3$ mixture), which also chemically polished the surfaces. The surfaces were then electrically passivated by PECVD deposition of a silicon nitride film. The volume lifetime was then measured by µ-wave-PCD (photoconductive decay) as described by Stevenson et al. in Appl. Phys. Lett. 26, 190 (1955) or by the IC-QssPC (inductively-coupled quasi-steady-state photoconductive decay) technique as described by Sinton et al. in Appl. Phys. Lett. 69, 2510 (1996).

The charge carrier lifetime of this silicon wafer only having undergone a phosphorus diffusion treatment was 125 µs.

Example According to the Invention

The second silicon wafer prepared was subjected to the same treatment as the wafer of the above comparative example, except that the phosphorus diffusion step was preceded by a rapid annealing step, i.e. a heat treatment having two temperature holds:
  a first hold at 830° C. for 15 seconds; and
  a second hold at 885° C. for 15 seconds.

The rates of temperature rise to 830° C. and 885° C. were 30° C./second.

The heating was carried out in a lamp furnace.

For the cooling step, the lamp furnace was turned off and the silicon wafer subjected to forced cooling using blowers.

The rapid annealing step was carried out in air.

The wafer was then subjected in a standard manner to an impurity extraction step using phosphorus diffusion.

The charge carrier lifetime of this silicon wafer purified by the method of the invention was 156 µs, i.e. slightly higher than that of the wafer having undergone only a phosphorus diffusion step.

This shows that the metallic impurities put into solution during the rapid annealing step were extracted during the phosphorus diffusion step.

The density of precipitated metallic impurities in wafers treated by the purification method of the invention is therefore lower than the density of precipitated metallic impurities in wafers subjected only to a phosphorus diffusion step.

Consequently, the electrical properties of the substrates that have undergone the purification method of the invention are less sensitive to rapid annealing that follows the screen printing step for establishing the metal contacts.

Although in the preceding description the extraction of impurities by external gettering was described as being a phosphorus diffusion step, various techniques that involve external gettering of impurities, such as gettering by damage, by polysilicon deposition, by formation of a porous layer or by a highly-doped substrate (epilayers) or by the formation of nano-cavities or by an aluminum-silicon alloy, may also be used. All these techniques can be used in the methods of the invention.

The invention claimed is:

1. A method of purifying a crystalline silicon substrate of the type that includes a step of extracting impurities by external gettering, comprising:
  before said step of extracting the impurities by external gettering, at least one step of heating the substrate at a temperature of between 750° C. and 1000° C. inclusive for a time of between 1 second and 10 minutes inclusive,
  followed by a step of cooling the substrate down to room temperature either by natural cooling or by forced cooling at a rate greater than 3° C./second, after the heating source has been turned off.

2. The method of purifying a crystalline silicon substrate as claimed in claim 1, wherein the step of extracting the impurities by external gettering is a phosphorus diffusion step.

3. The method as claimed in claim 2, wherein said at least one step of heating the substrate comprises a single heating step at a single temperature, followed by a step of cooling the substrate down to room temperature either by natural cooling or by forced cooling at a rate greater than 3° C./second, after the heating source has been turned off.

4. The method as claimed in claim 2, further comprising at least two heating steps at different temperatures for identical or different times, followed by a step of cooling the substrate down to room temperature either by natural cooling or by forced cooling at a rate greater than 3° C./second, after the heating source has been turned off.

5. The method as claimed in claim 2, wherein said at least one step of heating the substrate comprises a heating step at between 800° C. and 850° C. for 1 to 20 seconds and a heating step at between 850° C. and 920° C. for 1 to 20 seconds, followed by a step of cooling the substrate down to room temperature either by natural cooling or by forced cooling at a rate greater than 3° C./second, after the heating source has been turned off.

6. The method as claimed in claim 1, wherein said at least one step of heating the substrate comprises a single heating step at a single temperature, followed by a step of cooling the substrate down to room temperature either by natural cooling or by forced cooling at a rate greater than 3° C./second, after the heating source has been turned off.

7. The method as claimed in claim 1, further comprising at least two heating steps at different temperatures for identical or different times, followed by a step of cooling the substrate down to room temperature either by natural cooling or by forced cooling at a rate greater than 3° C./second, after the heating source has been turned off.

8. The method as claimed in claim 7, wherein said at least one step of heating the substrate comprises a heating step at between 800° C. and 850° C. for 1 to 20 seconds and a heating step at between 850° C. and 920° C. for 1 to 20 seconds, followed by a step of cooling the substrate down to room temperature either by natural cooling or by forced cooling at a rate greater than 3° C./second, after the heating source has been turned off.

9. The method as claimed in claim 1, wherein said at least one step of heating the substrate comprises a heating step at between 800° C. and 850° C. for 1 to 20 seconds and a heating step at between 850° C. and 920° C. for 1 to 20 seconds, followed by a step of cooling the substrate down to room temperature either by natural cooling or by forced cooling at a rate greater than 3° C./second, after the heating source has been turned off.

10. A process for producing a photovoltaic cell of the type that comprises a step of texturing the surfaces of a crystalline silicon substrate, which additionally includes the purification of the crystalline silicon constituting the substrate by a method that includes a step of extracting the impurities by external gettering and comprising:
before said step of extracting the impurities by external gettering, at least one step of heating the substrate at a temperature of between 750° C. and 1000° C. inclusive for a time of between 1 second and 10 minutes inclusive,
followed by a step of cooling the substrate down to room temperature either by natural cooling or by forced cooling at a rate greater than 3° C./second, after the heating source has been turned off.

11. The process as claimed in claim 10, wherein the purification of the crystalline silicon is implemented before the step of texturing the surfaces of the crystalline silicon substrate.

12. The process as claimed in claim 10, wherein the purification of the crystalline silicon constituting the substrate is implemented after the step of texturing the surfaces of the crystalline silicon substrate.

13. A process for producing a photovoltaic cell of the type that includes a step of texturing the surfaces of a crystalline silicon substrate, which additionally comprises the purification of the crystalline silicon constituting the substrate by a method that includes a step of extracting the impurities by a phosphorus diffusion step, comprising:
before said step of extracting the impurities by a phosphorus diffusion step, at least one step of heating the substrate at a temperature of between 750° C. and 1000° C. inclusive for a time of between 1 second and 10 minutes inclusive,
followed by a step of cooling the substrate down to room temperature either by natural cooling or by forced cooling at a rate greater than 3° C./second, after the heating source has been turned off.

14. The process as claimed in claim 13, wherein the purification of the crystalline silicon constituting the substrate is implemented before the step of texturing the surfaces of the crystalline silicon substrate.

15. The process according to claim 13, wherein the purification of the crystalline silicon constituting the substrate is implemented after the step of texturing the surfaces of the crystalline silicon substrate.

16. A process for producing a photovoltaic cell of the type that includes a step of texturing the surfaces of a crystalline silicon substrate, which additionally comprises the purification of the crystalline silicon constituting the substrate by a method that includes a step of extracting the impurities by external gettering, a single heating step at a single temperature, of between 750° C. and 1000° C. inclusive for a time of between 1 second and 10 minutes inclusive, followed by a step of cooling the substrate down to room temperature either by natural cooling or by forced cooling at a rate greater than 3° C./second, after the heating source has been turned off.

17. The process as claimed in claim 16, wherein the purification of the crystalline silicon is implemented before the step of texturing the surfaces of the crystalline silicon substrate.

18. The process as claimed in claim 16, wherein the purification of the crystalline silicon is implemented after the step of texturing the surfaces of the crystalline silicon substrate.

19. A process for producing a photovoltaic cell of the type that includes a step of texturing the surfaces of a crystalline silicon substrate, which additionally comprises the purification of the crystalline silicon constituting the substrate by a method that includes a step of extracting the impurities by external gettering comprising:
before said step of extracting the impurities by external gettering, at least two heating steps at different temperatures, of between 750° C. and 1000° C. inclusive for identical or different times of between 1 second and 10 minutes inclusive,
followed by a step of cooling the substrate down to room temperature either by natural cooling or by forced cooling at a rte greater than 3° C./second, after the heating source has been turned off.

20. The process as claimed in claim 19, wherein the purification of the crystalline silicon is implemented before the step of texturing the surfaces of the crystalline silicon substrate.

* * * * *